United States Patent
Carducci et al.

(10) Patent No.: US 10,242,847 B2
(45) Date of Patent: *Mar. 26, 2019

(54) PLASMA PROCESSING APPARATUS AND LINER ASSEMBLY FOR TUNING ELECTRICAL SKEWS

(71) Applicant: Applied Materials, Inc., Santa Clara, CA (US)

(72) Inventors: James D. Carducci, Sunnyvale, CA (US); Zhigang Chen, Campbell, CA (US); Shahid Rauf, Pleasanton, CA (US); Kenneth S. Collins, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 631 days.

This patent is subject to a terminal disclaimer.

(21) Appl. No.: 14/738,324

(22) Filed: Jun. 12, 2015

(65) Prior Publication Data

US 2015/0279633 A1 Oct. 1, 2015

Related U.S. Application Data

(62) Division of application No. 13/184,562, filed on Jul. 17, 2011, now abandoned.

(Continued)

(51) Int. Cl.
*H01L 21/00* (2006.01)
*C23C 16/00* (2006.01)
(Continued)

(52) U.S. Cl.
CPC .. *H01J 37/32623* (2013.01); *H01J 37/32082* (2013.01); *H01J 37/32458* (2013.01);
(Continued)

(58) Field of Classification Search
None
See application file for complete search history.

(56) References Cited

U.S. PATENT DOCUMENTS 5,366,585 A 11/1994 Robertson et al.
5,460,684 A 10/1995 Saeki et al.
(Continued)

FOREIGN PATENT DOCUMENTS

CN 101315877 A 12/2008
CN 101452805 A 6/2009
(Continued)

OTHER PUBLICATIONS

JP2008-300410A, Sato et al., Substrate Treatment System, and Substrate Treatment Equipment, Dec. 11, 2008, Tokyo Electron Ltd., paragraphs [0042]-[0046].*

(Continued)

*Primary Examiner* — Sylvia MacArthur
*Assistant Examiner* — Michelle Crowell
(74) *Attorney, Agent, or Firm* — Patterson + Sheridan LLP

(57) ABSTRACT

The invention discloses a plasma processing apparatus comprising a chamber lid, a chamber body and a support assembly. The chamber body, defining a processing volume for containing a plasma, for supporting the chamber lid. The chamber body is comprised of a chamber sidewall, a bottom wall and a liner assembly. The chamber sidewall and the bottom wall define a processing volume for containing a plasma. The liner assembly, disposed inside the processing volume, comprises of three or more slots formed thereon for providing an axial symmetric RF current path. The support assembly supports a substrate for processing within the chamber body. With the liner assembly with several sym- (Continued)

metric slots, the present invention can prevent electromagnetic fields thereof from being azimuthal asymmetry.

12 Claims, 6 Drawing Sheets

Related U.S. Application Data

(60) Provisional application No. 61/366,462, filed on Jul. 21, 2010.

(51) Int. Cl.
*H01J 37/32* (2006.01)
*H01L 21/67* (2006.01)

(52) U.S. Cl.
CPC .. *H01J 37/32495* (2013.01); *H01L 21/67069* (2013.01); *Y10T 428/13* (2015.01)

(56) References Cited

U.S. PATENT DOCUMENTS

| | | | |
|---|---|---|---|
| 5,494,523 A | 2/1996 | Steger et al. | |
| 5,565,058 A | 10/1996 | Banholzer et al. | |
| 5,641,375 A | 6/1997 | Nitescu et al. | |
| 5,763,851 A * | 6/1998 | Forster | H01J 37/321 156/345.48 |
| 5,891,350 A | 4/1999 | Shan et al. | |
| 6,074,953 A | 6/2000 | Donohoe et al. | |
| 6,171,438 B1 | 1/2001 | Masuda et al. | |
| 6,251,216 B1 | 6/2001 | Okamura et al. | |
| D491,963 S | 6/2004 | Doba | |
| 9,653,267 B2 * | 5/2017 | Carducci | H01J 37/32495 |
| 9,741,546 B2 * | 8/2017 | Carducci | H05H 1/46 |
| 2001/0008173 A1 | 7/2001 | Watanabe et al. | |
| 2002/0069970 A1 | 6/2002 | Noorbakhsh et al. | |
| 2002/0102858 A1 | 8/2002 | Wicker et al. | |
| 2003/0006008 A1 | 1/2003 | Horioka et al. | |
| 2004/0035364 A1 | 2/2004 | Tomoyoshi et al. | |
| 2006/0086458 A1 * | 4/2006 | Kim | H01J 37/32477 156/345.1 |
| 2007/0240979 A1 | 10/2007 | Nozawa et al. | |
| 2007/0283887 A1 | 12/2007 | Tian et al. | |
| 2008/0178797 A1 * | 7/2008 | Fodor | C23C 16/46 118/75 |
| 2009/0242128 A1 * | 10/2009 | Tago | H01J 37/32091 156/345.28 |
| 2009/0250169 A1 | 10/2009 | Carducci et al. | |
| 2013/0087286 A1 | 4/2013 | Carducci et al. | |
| 2013/0118686 A1 | 5/2013 | Carducci et al. | |
| 2016/0314940 A1 * | 10/2016 | Carducci | H05H 1/46 |
| 2017/0271129 A1 * | 9/2017 | Carducci | H05H 1/46 |

FOREIGN PATENT DOCUMENTS

| | | |
|---|---|---|
| JP | 2004079557 A | 3/2004 |
| JP | 2004363316 A | 12/2004 |
| JP | 2006111906 A | 4/2006 |
| JP | 2008300410 A | 12/2008 |
| KR | 20070089618 A | 8/2007 |
| KR | 20080104992 A | 12/2008 |
| KR | 20090057921 A | 6/2009 |

OTHER PUBLICATIONS

JP2009-140939A, Tojo et al., Processing container and Plasma Treating Apparatus, Jun. 25, 2009, Tokyo Electron Ltd. paragraphs [0054]-[0055].*
Office Action from Japanese Patent Office for corresponding Japanese Patent Application No. 2013-520730, dated Jun. 9, 2015 (5 pgs.), with translation (5 pgs.).
Official Letter dated Aug. 19, 2015, from the China Patent Office for corresponding China Patent Application No. 201180021201.4.
Office Action from Chinese Patent Application Serial No. 201180021201.4 dated Aug. 30, 2016.
Office Action from Japanese Patent Application No. 2013-520730 dated Apr. 5, 2016.
Office Action from Korean Patent Application No. 10-2012-7027857 dated Jun. 20, 2017.

* cited by examiner

PLASMA PROCESSING APPARATUS AND LINER ASSEMBLY FOR TUNING ELECTRICAL SKEWS

CROSS REFERENCE TO RELATED APPLICATIONS

This application is a divisional of U.S. patent application Ser. No. 13/184,562, filed on Jul. 17, 2011, and claims benefit of U.S. Provisional Patent Application Ser. No. 61/366,462, filed Jul. 21, 2010, both of which are incorporated by reference in their entirety.

BACKGROUND OF THE INVENTION

Field of the Invention

The present invention relates generally to a pasha processing apparatus for fabricating electronic substrates in which plasma is excited by RF power applied between electrodes. More specifically, the present invention relates to a liner assembly disposed inside the plasma processing apparatus for balancing RF current flow launched from the electrodes.

Description of the Prior Art

Electronic devices, such as flat panel displays and integrated circuits, commonly are fabricated by a series of process steps in which layers are deposited on a substrate and the deposited material is etched into desired patterns. The process steps commonly include physical vapor deposition (PVD), chemical vapor deposition (CVD) plasma enhanced CVD (PECVD) and plasma process. Specifically, the plasma process requires supplying process gas mixture to a vacuum chamber called a chamber body, and then applying electrical or electromagnetic power (RF power) to excite the process gas to a plasma state. In other words, the process gas is excited into the plasma by the RE current launched from electrodes. The plasma decomposes the gas mixture into on species that perform the desired deposition or etch process.

Generally, the substrate can be delivered from the transfer chamber to the chamber body via transfer mechanisms (e.g. robot blade) and be placed on a support assembly (e.g., susceptor or pedestal) of each chamber body for processing. Furthermore, the chamber body may also comprise a chamber liner to protect the inner walls of the chamber body. Please refer to FIG. 1A. FIG. 1 illustrates a perspective view of the traditional chamber liner. As shown in FIG. 1A, to receive the substrate delivered from the transfer chamber, the chamber liner 90, disposed inside a chamber body, usually has a corresponding slot 902 for receiving the substrate which is aligned with the slit valve tunnel of the chamber body.

During substrate processing, RF currently launched from the electrodes returns to the power source on the surface of the chamber liner. Since the RF return current does not travel across the gap defined by the slot 902, the RF return current travels "around" the slot 902. This causes an area of RF current concentration at the lateral edges of the slot 902, and an area of low RF current to the top and bottom of the slot, thereby causing an azimuthal asymmetric perturbation in RF current flow, as illustrated in FIG. 1B.

FIG. 1B illustrates a schematic view of the traditional chamber liner 90 from line A-A to line B-B for indicating asymmetric RF current flow according to FIG. 1A. As shown in FIG. 1B, RF current flow (shown by dotted lines $I_{90}$) is perturbed by the slot 902, that is, the slot 902 creates area of high concentration $I_{92}$ which can lead to an azimuthal asymmetry in the electromagnetic fields and ultimately the plasma casing non-uniform etch rate relative to the slot 902.

The electrical skews could hardly be prevented in the plasma process because the traditional chamber liner failed to provide a balanced RF current flow and led to the defective plasma process. It is important that the RF current distribution within the chamber be symmetric, such that the electromagnetic fields for the plasma to provide the uniform azimuthal etch or deposition rate. Therefore, a need exists for balancing RF current flow along the chamber liner that prevents the above-mentioned problems.

SUMMARY OF THE INVENTION

Embodiments of the invention provide a liner assembly configured to balancing RF current flowing thereon. According to one embodiment of the invention, a liner is provided that comprises three or more slots to provide an axial symmetric RF current path, wherein one slot is a substrate access port.

In another embodiment of the invention, a plasma processing apparatus is provided that includes a liner for balancing RF current flow within the apparatus.

In one embodiment of the invention, the plasma processing apparatus includes a chamber body having liner disposed therein. The line includes three or more slots formed therethrough for providing an axial symmetric RF current path.

The additional embodiments of the present invention will no doubt become understood to those of ordinary skill in the art after reading the following detailed description, which is illustrated in following figures and drawings.

BRIEF DESCRIPTION OF THE APPENDED DRAWINGS

The teachings of the present invention can be readily understood by considering the following detail description in conjunction with the accompanying drawings, in which.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
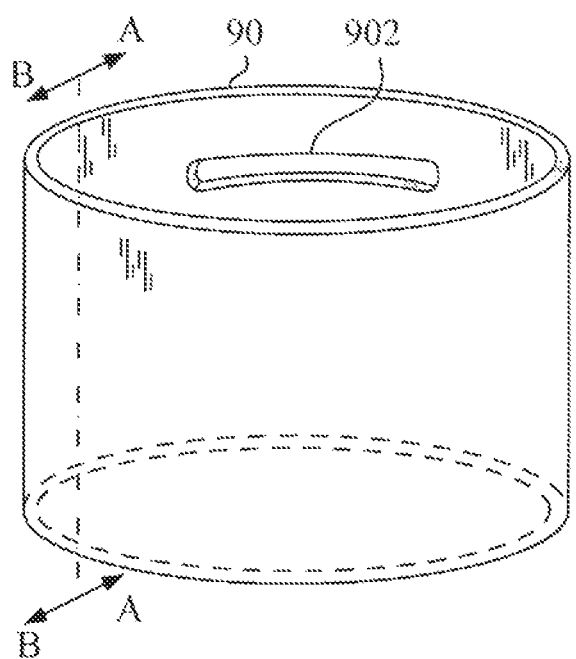
FIG. 1A illustrates a perspective view of the conventional chamber liner.
Figure 1B:
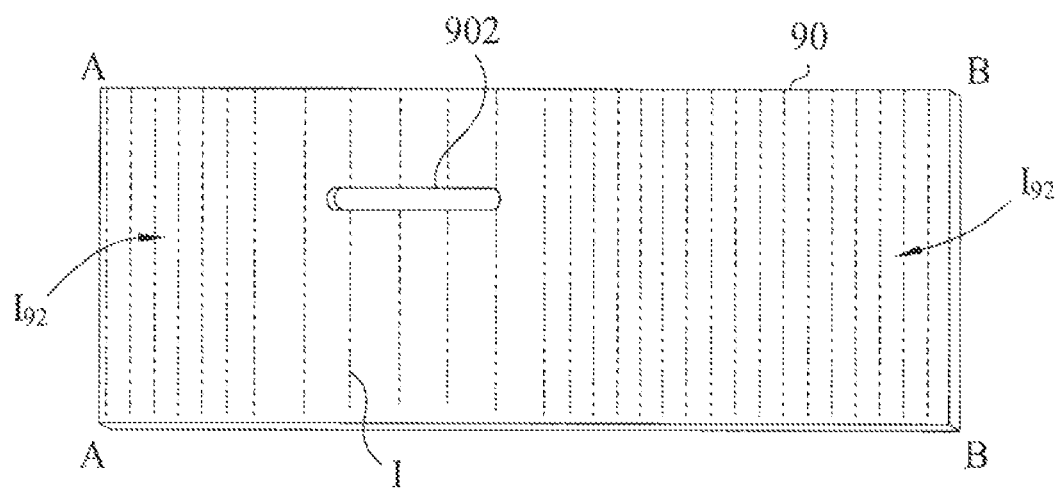
FIG. 1B illustrates a projection of the conventional chamber liner of FIG. 1A taken along section line A-A to line B-B for indicating asymmetric RF current distribution of the surface of the liner.
Figure 2:
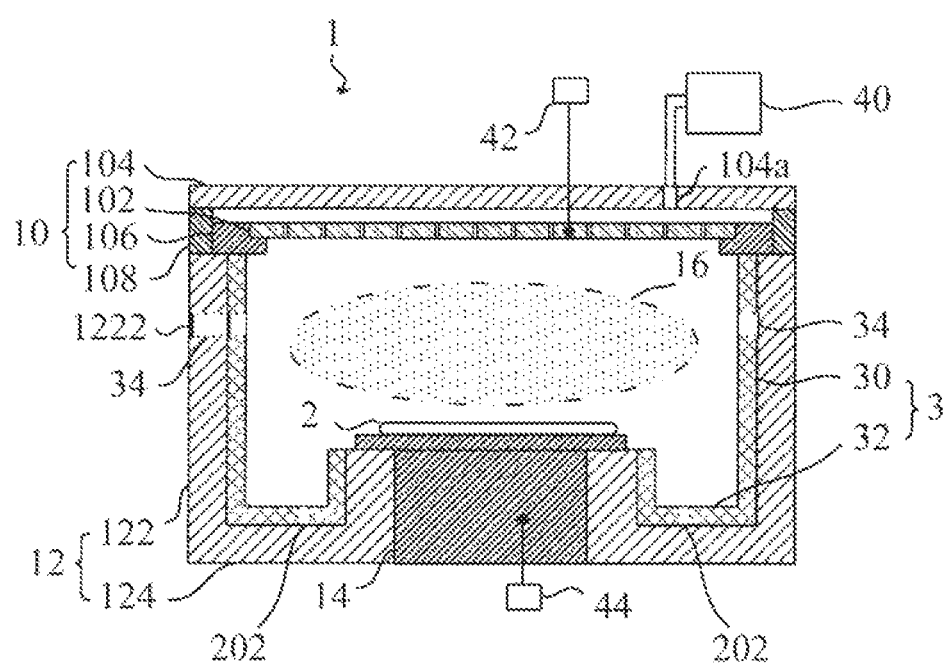
FIG. 2 illustrates schematic view of a processing apparatus according to one embodiment of the invention.

FIG. 2 illustrates a schematic view of a plasma processing apparatus according to one embodiment of the invention. The plasma processing apparatus may be a plasma etch chamber, a plasma enhanced chemical vapor deposition chamber, a physical vapor deposition chamber, a plasma treatment chamber, an ion implantation chamber or other suitable vacuum processing chamber. As shown in FIG. 2, the plasma processing apparatus 1 comprises a chamber lid 10, a chamber body 12 and a substrate support assembly 14. The chamber body 12 supports the chamber lid 10 to enclose a processing region. The substrate support assembly 14 is disposed in the chamber body 12 below the lid 10. All components of the plasma processing apparatus 1 are described below respectively.

In one embodiment, the chamber lid 10 includes a showerhead assembly 102, a lid plate 104, an insulator 106 and a spacer 108. The lid plate 104 is generally seated on the chamber body 12 and is typically coupled thereto by a hinge (not shown) to allow the chamber lid 10 to be opened, exposing the interior of the chamber body 12. The showerhead assembly 102 is typically comprised of a conductive material and coupled to a RF power source 42 to serve as an electrode for driving a plasma 16 formed within the chamber body 12. In other embodiments, an RF power source 44 may be coupled to the substrate support assembly 14, such that the support serves as the electrode. The chamber lid 10 is generally connected to a gas source 40 for introducing a process gas into the processing volume. Specifically, the lid plate 104 may comprise of an injection port 104a for receiving the process gases from the gas source 40, the gases then flowing into the interior of the chamber body 12 through the showerhead assembly 102. The showerhead assembly 102 facilitates uniform process gas delivery to a substrate 2 disposed on the substrate support assembly 14.

The showerhead assembly 102 is electrically isolated from the lid plate 104 by the insulator 106. The insulator 106 may comprise an inner ledge (not shown) for supporting the showerhead assembly 102. The spacers 108 are RF conductive and disposed between the chamber body 12 and the lid plate 104 and provide part of an RF return path, as further discussed below.

The chamber body 12 comprises a chamber cider, all 122 and a bottom wall 124. The chamber sidewall 122 and bottom wall 124 may be fabricated from a unitary block of aluminum. The chamber sidewall 122 and the bottom wall 124 of the chamber body 12 define a processing volume for confining the plasma 16. The processing volume is typically accessed through a slit valve tunnel 1222 in the chamber sidewall 122 that facilitates movement of a substrate 2 into and out of the chamber body 12. In practice, a slit valve tunnel 1222 is formed on the chamber sidewall 122 for allowing entry and egress of the substrate 2 to/from the chamber body 12.

A liner assembly 3 is disposed inside the processing volume. In one embodiment, the liner assembly 3 includes a chamber 30 and a bottom liner 32. The liner assembly 3 is removable to allow periodic clearing and maintenance. The liner assembly 3 may also include a passage 202 for flowing a coolant therethrough so that the temperature of the liner may be regulated. The chamber liner 30 includes two or more slots 34 and is generally cylindrically-shaped, but may alternatively take the shape of the interior wall of chambers having other geometries. At least one of the slots 34 is suitable for passage of the substrate 2, and is aligned with the slit valve tunnel 1222. In one embodiment, the slots 34 have an elongated horizontal orientation. The bottom liner 32, engaged to the chamber liner 30, comprises a bowl portion and an optional innermost cylindrically portion, wherein the chamber sidewall 122 and the bottom wall 124 are shielded from the plasma 16 by the chamber liner 30 and the bottom liner 32. In practice, the liner assembly 3 is disposed about the substrate support assembly 14 and circumscribes the interior, vertical surfaces of the chamber body 12. The liner assembly 3 may further comprise an outer ledge (not shown) for being detachably fixed the liner assembly 3 to the amber sidewall 122. The liner assembly 3 may be constructed of any process compatible material such as aluminum or yttria.

The slots 34 are formed symmetrically through the chamber liner 30 for providing an axial symmetric RF current path. As discussed above, one of the slots 34 aligned with the slit valve tunnel 1222, while the other slots 34 are distributed around the chamber liner 30 in a position that compensates for changes RF current density and/or distribution present on the liner 30 due to the apertures of the slot 34 aligned with the slit valve tunnel 1222. In one embodiment, the slots 34 are arranged in a polar array, and may be spaced apart equidistantly in a substantially horizontal orientation (i.e., in an orientation perpendicular to a center axis of the liner assembly 3.

The substrate support assembly 14 supports the substrate 2 during the processes within the chamber body 12. In practice, the substrate support assembly 14 may include at least one embedded heating element (not shown). Moreover, the substrate 2 can be, but not limited to, a flat panel display, round wafer, liquid crystal display, glass panel substrate, plastic substrate, and the like. The substrate support assembly 14 may also be electrically connected to a RF power source 44 to provide the substrate 2 bias as desired for particular processes. In this embodiment, the showerhead assembly 102 (first electrode) and the substrate support assembly 14 (second electrode) can apply an RF power across processing volume for exciting the process gases into the plasma 16.

Figure 3A:
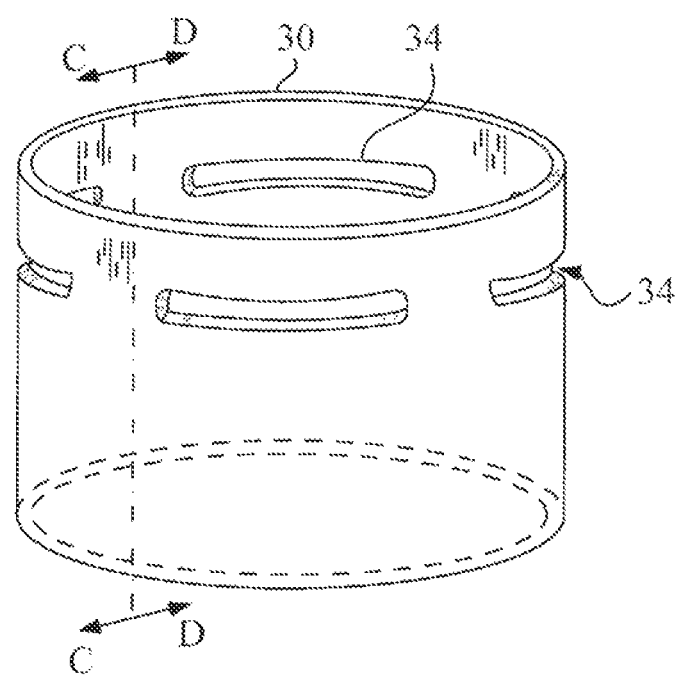
FIG. 3A illustrates a perspective view of the chamber liner according to one embodiment of the invention.

According to one embodiment of the invention, the symmetrically slotted chamber liner 30 can be further shown in FIG. 3A. FIG. 3A illustrates a perspective view of the chamber liner according to one embodiment of the invention. As shown in FIG. 3A, the chamber liner 30 has a plurality of symmetrically formed slots 34, wherein one of the slots 34 sized for transferring substrates. The other slots 34, for example, are designed for tuning the electrical skews in the plasma process, for example, to compensate of the RF current density concentrations at the edges of the slot 34 utilized for substrate transfer through liner. It should be noticed that the slots shall be spaced symmetrically (i.e., in a polar array about the centerline of the liner 30) to provide an axial and azimuthally symmetric RF current return path for the RF current launched from the electrode(s) and returning to the power source through chamber liner 30.

In one embodiment, the plurality of slots 34 of the have the same size. In another embodiment, the plurality of slots 34 are two slots spaced 180 degrees apart. In another embodiment, the plurality of slots 34 are three slots spaced 120 degrees apart. In another embodiment, the plurality of slots are four slots spaced 90 degrees apart.

Figure 3B:
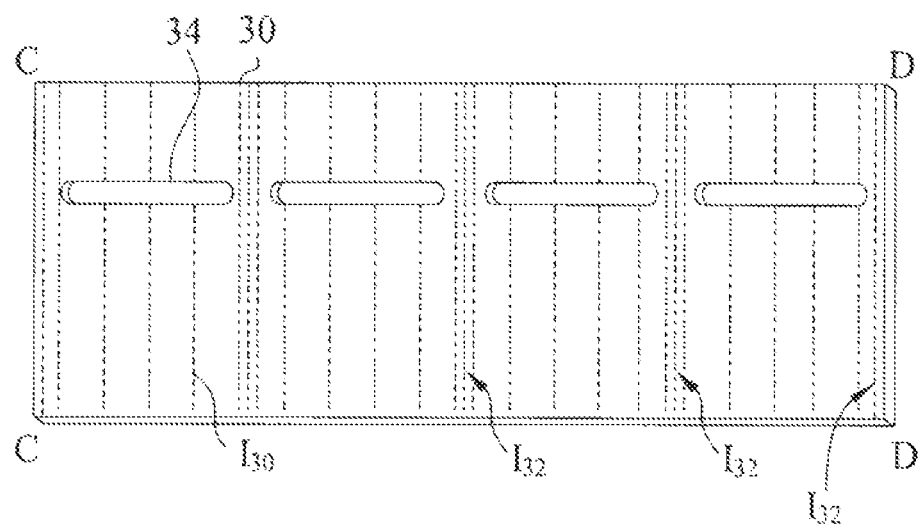
FIG. 3B illustrates a projection of the chamber liner from line C-C to line D-D for indicating substantially symmetric RF current flow according to FIG. 3A.

FIG. 3B illustrates a schematic projection of the chamber liner 30 taken from line C-C to line D-D, illustrating symmetric RF current flow across the liner 30. As shown in FIG. 3, the slots 34 are of equal size and symmetrically formed through the chamber liner 30 such that the paths of RF current flow (shown by dotted lines $I_{30}$) are symmetrically perturbed by the slots 34. This causes symmetric areas of increase currant density $I_{32}$ to be uniformly distributed around the chamber liner 30. It should be noticed that the slots 34 do not need to be disposed on the chamber liner 30 at the same vertical level as long as the pattern of slots 34 are symmetric. Designers can create a desired path of the RF current flow $I_{30}$ by changing the pattern/location of the slots 34. In practice, the symmetry of RF current flow $I_{30}$ can enhance azimuthal symmetry of the electromagnetic fields, and thereby enhance the uniformity of plasma processing results. It is also contemplated that the position of the slots 34 may be located to create an asymmetry of RF return current flow through the liner assembly 3 to tune out another electrical or conductance asymmetry within the processing apparatus 1 such that the resultant effect is a more uniformly distributed plasma within the processing chamber, thereby substantially eliminating azimuthal plasma skews.

Figure 4:
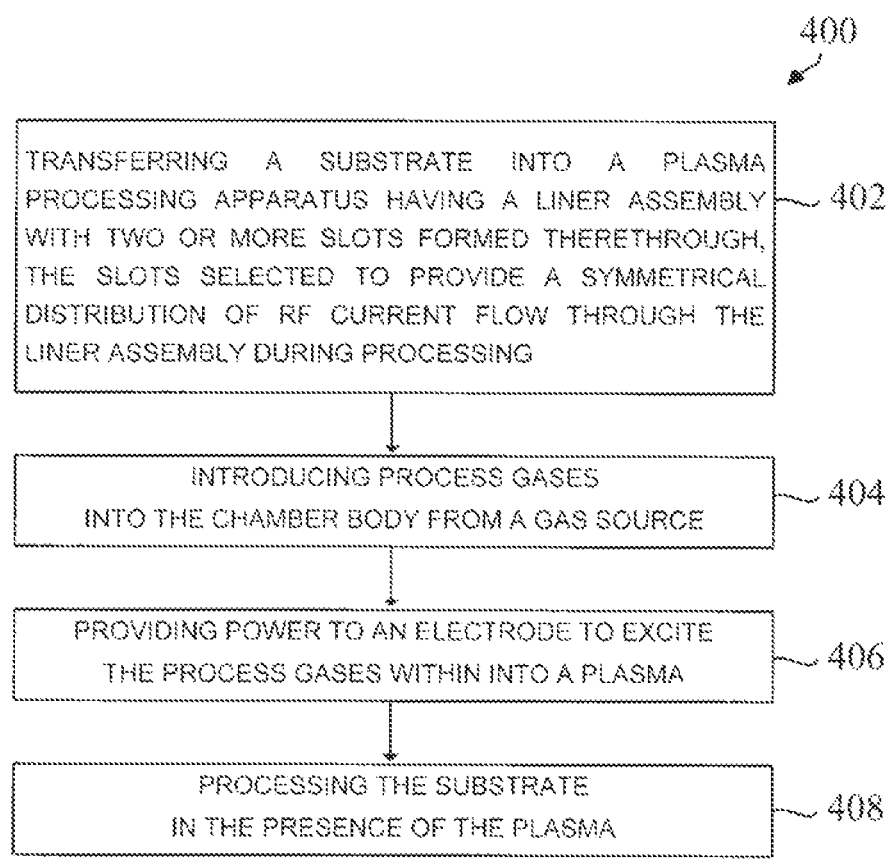
FIG. 4 is a flow chart illustrating one embodiment of a plasma process according to one embodiment.

To clearly describe the features and spirits of the invention, a flow diagram is provided in FIG. 4 for illustrating one embodiment of a plasma process 400 performed in accordance to one embodiment of the invention. The process 400 begins at 402 by transferring a substrate into a plasma processing apparatus 1 having a liner assembly 3 with two or more slots 34 formed therethrough, the slots 34 selected to provide a symmetrical distribution of RF current flow through the liner assembly 3 during processing. At 404, process gases are introduced into the chamber body 12 from the gas source 40. At 406, power is provided to the electrode (i.e., from one or both of the showerhead assembly 102 or substrate support assembly 14) to excite the process gases within the processing apparatus 1 into the plasma 16. At 408, the substrate is processed in the presence of the plasma. While the power is applied to the electrode during processing, RF current flows symmetrically through the liner assembly 3 to return to the power source as discussed above. The symmetric RF current flow through the liner assembly 3 enhances azimuthal uniformity of the plasma within the chamber, thereby enhancing processing results. Plasma processing the substrate may include, but is not limited to, performing an plasma etch process, a plasma enhanced chemical vapor deposition process, a physical vapor deposition process, a plasma treatment process a ion implantation process or other plasma assisted semiconductor process.

In summary, the present invention provides the liner assembly symmetric slots for balancing RF current flow coupled to the liner assembly. Furthermore, the slots can also be formed in certain patterns for creating desired path of the RF current flow to tune the azimuthal plasma skews.

With the example and explanations above, the features and spirits of the embodiments of the invention are described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A liner assembly, for use in a plasma processing apparatus, comprising:
   a cylindrical body having an outer wall dimensioned to slip inside of a sidewall of the plasma processing apparatus, the cylindrical body having three slots of equal size formed therethrough and arranged in their entirety along a circular arc and spaced 120 degrees apart, and wherein only one of the slots is configured to align with an opening in a wall of the plasma processing apparatus and allow a substrate to pass through the slot and the remaining slots are dummy slots aligned in a portion of the wall having no structures.

2. The liner assembly of claim 1, wherein the three or more slots are spaced equidistantly apart.

3. The liner assembly of claim 2, wherein three or more slots are coplanar.

4. The liner assembly of claim 1, wherein the cylindrical body further comprises:
   a bottom coupled to the outer wall; and
   an inner wall coupled to the bottom and dimensioned to slip over a substrate support of the processing apparatus.

5. The liner assembly of claim 1, wherein the cylindrical body further comprises:
   a coolant passage formed therein.

6. A plasma processing apparatus, comprising:
   a chamber body having a sidewall and bottom wall, wherein the chamber sidewall and the bottom wall define a processing volume for containing a plasma, the sidewall having a slit valve tunnel formed therethrough;
   a lid assembly disposed on the chamber body; and
   a liner assembly comprising a cylindrical body having an outer wall dimensioned to slip inside of a sidewall of the plasma processing apparatus, the cylindrical body having three slots of equal size formed therethrough and arranged entirely along a circular arc and spaced 120 degrees apart, wherein only one of the slots is configured to align with the slit valve tunnel and allow a substrate to pass through the liner, and the remaining slots are dummy slots aligned in a portion of the wall having no structures, and wherein the slots are arranged to produce an axial symmetric RF return current path through the liner assembly.

7. The plasma processing apparatus of claim 6, wherein the three slots are spaced equidistantly apart.

8. The plasma processing apparatus of claim 7, wherein the three slots are coplanar.

9. The plasma processing apparatus of claim 6, wherein the liner assembly further comprises:
   an outer wall dimensioned to slip inside of the sidewall of the chamber body; and
   a bottom coupled to the outer wall.

10. The plasma processing apparatus of claim 9, wherein the liner assembly further comprises:
    an inner wall coupled to the bottom and dimensioned to slip over the substrate support.

11. The plasma processing apparatus of claim 6, wherein the liner assembly further comprises:
    a coolant passage formed therein.

12. The liner assembly of claim 1 wherein the pattern of the slots is horizontally symmetric and vertically asymmetrical.

* * * * *

UNITED STATES PATENT AND TRADEMARK OFFICE
CERTIFICATE OF CORRECTION

PATENT NO. : 10,242,847 B2
APPLICATION NO. : 14/738324
DATED : March 26, 2019
INVENTOR(S) : James D. Carducci et al.

It is certified that error appears in the above-identified patent and that said Letters Patent is hereby corrected as shown below:

In the Specification

Column 1, Line 17, delete "pasha" and insert -- plasma --, therefor.

Column 1, Line 30, delete "(CVD)" and insert -- (CVD), --, therefor.

Column 1, Line 32, after "supplying" insert -- a --.

Column 1, Line 36, delete "RE" and insert -- RF --, therefor.

Column 1, Line 38, delete "on" and insert -- ion --, therefor.

Column 1, Line 42, delete "(e.g.," and insert -- (e.g. --, therefor.

Column 1, Line 46, delete "1" and insert -- 1A --, therefor.

Column 2, Line 2, delete "casing" and insert -- causing a --, therefor.

Column 2, Line 25, after "having" insert -- a --.

Column 2, Line 37, delete "detail" and insert -- detailed --, therefor.

Column 2, Line 45, after "illustrates" insert -- a --.

Column 2, Line 45, after "a" insert -- plasma --.

Column 3, Line 37, delete "cider, all" and insert -- sidewall --, therefor.

Column 3, Line 51, after "chamber" insert -- liner --.

Signed and Sealed this
Twenty-eighth Day of May, 2019

Andrei Iancu
*Director of the United States Patent and Trademark Office*

Column 3, Line 52, delete "clearing" and insert -- cleaning --, therefor.

Column 4, Line 3, delete "amber" and insert -- chamber --, therefor.

Column 4, Line 5, delete "material" and insert -- material, --, therefor.

Column 4, Line 8, after "34" insert -- is --.

Column 4, Line 42, after "through" insert -- the --.

Column 4, Line 53, after "slots" insert -- 34 --.

Column 4, Line 57, delete "3," and insert -- 3B, --, therefor.

Column 4, Line 61, delete "currant" and insert -- current --, therefor.

Column 5, Line 24, after "presence" insert -- of --.

Column 5, Lines 27-28, delete "symmetric" and insert -- symmetrical --, therefor.

Column 5, Line 34, delete "process a" and insert -- process, an --, therefor.

Column 5, Line 37, after "assembly" insert -- with --.

In the Claims

Column 6, Lines 5-6, Claim 2, after "three" delete "or more".

Column 6, Line 7, Claim 3, after "three" delete "or more".